US007262680B2

(12) United States Patent
Wang

(10) Patent No.: US 7,262,680 B2
(45) Date of Patent: Aug. 28, 2007

(54) COMPACT INDUCTOR WITH STACKED VIA MAGNETIC CORES FOR INTEGRATED CIRCUITS

(75) Inventor: Albert Z. H. Wang, Wilmette, IL (US)

(73) Assignee: Illinois Institute of Technology, Chicago, IL (US)

( * ) Notice: Subject to any disclaimer, the term of this patent is extended or adjusted under 35 U.S.C. 154(b) by 118 days.

(21) Appl. No.: 10/789,893

(22) Filed: Feb. 27, 2004

(65) Prior Publication Data

US 2005/0190035 A1 Sep. 1, 2005

(51) Int. Cl.
*H01F 5/00* (2006.01)
(52) U.S. Cl. .................................. 336/200; 257/531
(58) Field of Classification Search .............. 336/83, 336/200, 206–208, 232; 257/531
See application file for complete search history.

(56) References Cited

U.S. PATENT DOCUMENTS

| | | | |
|---|---|---|---|
| 3,614,554 A | | 10/1971 | Shield |
| 4,253,079 A | * | 2/1981 | Brosh ........................ 336/84 C |
| 5,396,101 A | * | 3/1995 | Shiga ......................... 257/531 |
| 5,552,756 A | * | 9/1996 | Ushiro ........................ 336/200 |
| 5,610,433 A | | 3/1997 | Merrill et al. |
| 5,852,866 A | * | 12/1998 | Kuettner et al. ............... 29/608 |
| 5,936,298 A | | 8/1999 | Capocelli et al. |
| 5,945,902 A | * | 8/1999 | Lipkes et al. ................ 336/200 |
| 6,101,371 A | | 8/2000 | Barber et al. |
| 6,114,937 A | | 9/2000 | Burghartz et al. |
| 6,114,939 A | | 9/2000 | Wittenbreder |
| 6,198,374 B1 | * | 3/2001 | Abel ........................... 336/200 |
| 6,301,114 B1 | | 10/2001 | Ootani |
| 6,304,164 B1 | | 10/2001 | Ohno et al. |
| 6,362,012 B1 | | 3/2002 | Chi et al. |
| 6,424,074 B2 | | 7/2002 | Nguyen |
| 6,480,086 B1 | * | 11/2002 | Kluge et al. ................. 336/200 |
| 6,535,101 B1 | | 3/2003 | Ahn et al. |
| 2002/0049042 A1 | | 4/2002 | Oida et al. |
| 2002/0097128 A1 | * | 7/2002 | Imam .......................... 336/200 |

FOREIGN PATENT DOCUMENTS

| | | |
|---|---|---|
| EP | 0 892 434 A2 | 1/1999 |
| GB | 2 381 130 A | 4/2003 |
| WO | WO 01/46971 A1 | 6/2001 |
| WO | WO 03/003390 A1 | 1/2003 |

* cited by examiner

*Primary Examiner*—Tuyen T. Nguyen
(74) *Attorney, Agent, or Firm*—Pauley Petersen & Erickson

(57) ABSTRACT

An on-chip inductor device for Integrated Circuits utilizes coils on a plurality of metal layers of the IC with electrical connectors between the coils and a magnetic core for the inductor of stacked vias running between the coils. The magnetic core is made from a series of stacked vias which are deposited between each metal layer of the IC having a coil. The magnetic core desirably includes an array of magnetic bars comprising the magnetic core. The via material of the magnetic core may be both magnetic and electrically conductive. The magnetic and electrically conductive via material may also be used for the planar coil electrical connectors or other electrically conductive parts of the IC, or both, thereby lessening fabrication steps. Films of magnetic material may be formed at the ends of the inductor to provide a closed magnetic circuit for the inductor. A high Q factor inductor of small (e.g., transistor) size is thus obtained. The materials and processes which enable the on-chip inductor device are compatible with ordinary IC fabrication methods.

23 Claims, 4 Drawing Sheets

COMPACT INDUCTOR WITH STACKED VIA MAGNETIC CORES FOR INTEGRATED CIRCUITS

BACKGROUND OF THE INVENTION

High performance on-chip inductors and transformers (hereafter sometimes referred as "inductors" or "microinductors" for simplicity) are highly desirable in mixed-signal/RF IC (radio frequency integrated circuit) design for increased miniaturization and performance and low power consumption for RF equipment. Past research has resulted in substantial advances in making micro-inductors. Designs ranging from simple stacked planar spiral inductors to complex MEMS (microelectromechanical system) inductors are currently known. However, further improvements over known designs are still desired. Current micro-inductors are very large in size and feature low quality factors (Q-factor) due to magnetic losses. Further, the techniques for manufacturing micro-inductors are not compatible with standard IC fabrication techniques, resulting in greater time and expense to obtain the on-chip inductors.

Complex MEMS techniques have been proposed to make micro-inductors with magnetic cores. For example, micromachined inductors with electroplated magnetic media (NiFe) in lateral bar form for use as a solenoid were reported by Jae Yeong Park and M. G. Allen; *Integrated Electroplated Micromachined Magnetic Devices Using Low Temperature Fabrication Processes*, IEEE Transactions on Electronics Packaging Manufacturing, Volume: 23 Issue: 1, Jan. 2000, p. 48. Micromachined inductors with electroplated magnetic media (NiFe) in a solenoid thin film spiral format were reported in, D. J. Sadler, Wenjin Zhang, Chong H. Ahn, Hi Jung Kim, and Suk Hee Han; *Micromachined Semi-Encapsulated Spiral Inductors For Microelectromechanical Systems (MEMS) Applications*; IEEE Transactions on Magnetics, Vol. 33, No. 5, 1997, p. 3319. RF spiral inductors with Co/Fe based sputtered magnetic film and extra planarization (a manufacturing technique used to smooth the surface of an IC wafer), running at 1 GHz and showing a 22% increase in inductance over air-cored devices and a 14% increase in quality factor, Q, have been reported in M. Yamaguchi, M. Baba, K. Suezawa, T. Arai, A. Haga, Y. Shimada, T. Tanabe and K. Itoh, *Improved RF Integrated Magnetic Thin-Film Inductors By Means Of Micro Splits And Surface Planarization Techniques*, IEEE Transactions on Magnetics, Vol. 36, No. 5, 2000, p. 3495. However, these microelectromechanical-based techniques are not truly compatible with CMOS (complementary metal oxide semiconductor) IC fabrication techniques because many add-on steps outside of traditional wafer fabrication are required in MEMS technology and therefore will add substantial costs to IC fabrication even if successful integration of MEMS and CMOS fabrication techniques could eventually be achieved.

Another obstacle to realizing single-chip RF IC design is that the known IC inductors are all currently too big to fit on a core RF circuit chip. For example, a size of 200 μm×200 μm is a typical footprint size for inductors fabricated in current 0.18 μm CMOS IC fabrication technology to achieve only a few nanoHenries (nH) inductance. By comparison, a typical bonding pad size is only 75 μm×75 μm in 0.18 μm CMOS IC technology. Since an RF IC chip usually needs many inductors, with inductance values ranging from a few nH to a few tens of nH, it is virtually impossible to design single-chip RF ICs using currently available inductor structures due to the large size of the inductors.

Without the development of a compact hi-Q inductor, realizing true single-chip RF ICs and systems-on-a-chip (SoC) will be very difficult and will delay the development of wireless information processing product improvements. It would therefore be desirable to develop new techniques compatible with standard IC fabrication techniques to fabricate compact, high-performance, on-chip inductors. The new compact IC inductors would desirably have a footprint size similar to a typical IC transistor, i.e., a few tens of micrometers (μm) in each dimension.

SUMMARY OF THE INVENTION

In response to the shortcomings of the prior art discussed above, the present invention provides for an on-chip or IC inductor which is compact enough to fit on a core circuit IC and has a magnetically permeable core which can be made with processes compatible with standard IC fabrication, thereby allowing a reduction in size from comparably performing inductors and providing economical fabrication costs, while achieving very high inductance and Q-factor values.

In IC technology, the conducting plug used to connect silicon (Si) and the first metal layer is called a "contact" and a conductor plug used to connect other higher level metal layers is called a "via." The present invention provides an IC inductor with a magnetic core created from magnetic plugs, or magnetic and conductive vias (sometimes referred to herein generically as "vias" for ease of explanation), which are stacked in alignment between the metal layers of the IC during the IC fabrication process to create at least one magnetic core bar running between the stacked planar spiral type conductors which create the coils of the inductor assembly. The stacked vias of the magnetic core are generally fabricated in the center area of the spiral conductors. The stacked via magnetic core may be a single stacked via bar structure, or may desirably constitute an array of magnetic bars within the magnetic core at the center of the spirals.

In one aspect of the invention the material of the stacked via magnetic core is an electrically conducting and magnetically permeable material, also sometimes called a "dual-use material" herein, for the core bars which can also be used for the electrical connectors between the stacked spiral conductors and/or layered metal in general thereby lessening fabrication steps in the making of the on-chip inductor. The connectors are also by definition "vias" but will be referred to as "connectors" to avoid confusion with the "vias" of the magnetic core. In some aspects of the invention, some or all conductors of the circuit may be made with the selected conductive/magnetic material of the stacked via magnetic core assembly to more economically fabricate the chips. In other aspects of the invention the selected conductive/magnetic material may be used only within the inductor assemblies. In other aspects a magnetic material compatible with the IC fabrication process may be deposited as films or caps at the two ends of the inductor assembly to provide a closed magnetic circuit inductor of high performance. In other aspects of the invention a material which favors magnetic permeability over electrical conductivity may be used appropriately to construct only the stacked via magnetic core or the magnetically permeable cap, or both, of the closed magnetic circuit inductor assembly.

According to one aspect of the present invention an on-chip inductor can be fabricated using traditional IC fabrication technologies, e.g., CMOS or BiCMOS, by replacing the traditional single-use electrical via/connector materials with new dual-use electrical/magnetic via materials and thus present additional cost and size saving advantages over MEMS fabricated inductors. Therefore, economical, high-integration RF IC chips such as SoC (system on chip) can be designed and fabricated in mainstream IC technologies.

In one aspect of the present invention the structure for the inductors is compatible with ITRS (International Technology Roundup for Semiconductors) predictions for future interconnect technologies down to sub-50 nm nodes. While current 180 nm (0.18 μm) technology uses six metal layers, at 50 nm nodes there are expected to be ten metal layers plus four optional metal layers for grounds/capacitors.

DEFINITIONS

"Ordinary IC fabrication methods" as used herein refers to processes compatible with standard IC fabrication materials, equipment, and technology.

"Magnetic" as used herein refers to that quality of magnetic permeability sufficient to provide a suitable inductor structure within the context of the present invention.

DETAILED DESCRIPTION OF THE PREFERRED EMBODIMENTS

Figure 1:
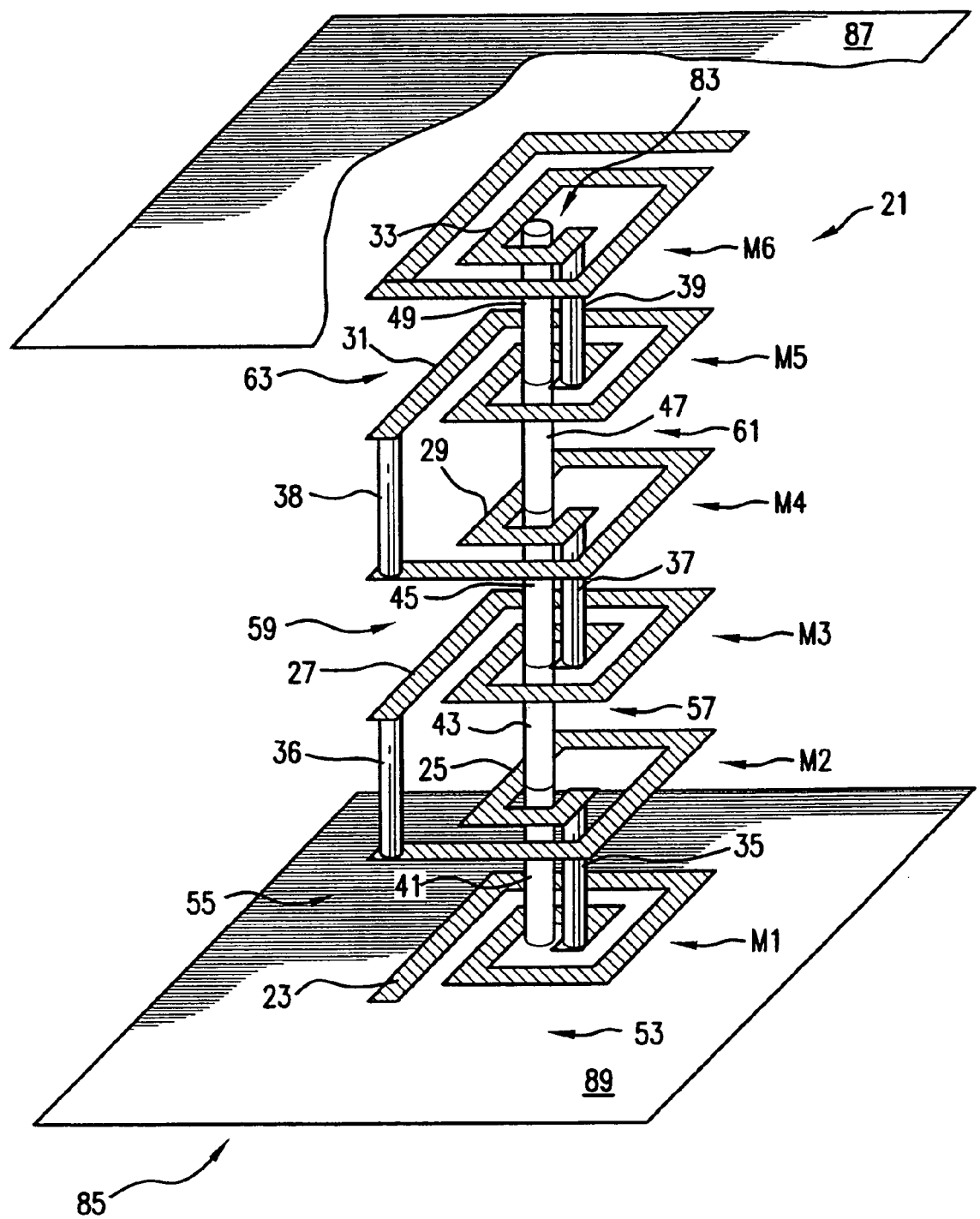
FIGS. 1-3 illustrate a six-metal IC inductor with a unitary stacked via bar magnetic core and a top and bottom magnetic cap layer according to the present invention in a perspective and a cross-sectional view, respectively.
Figure 2:
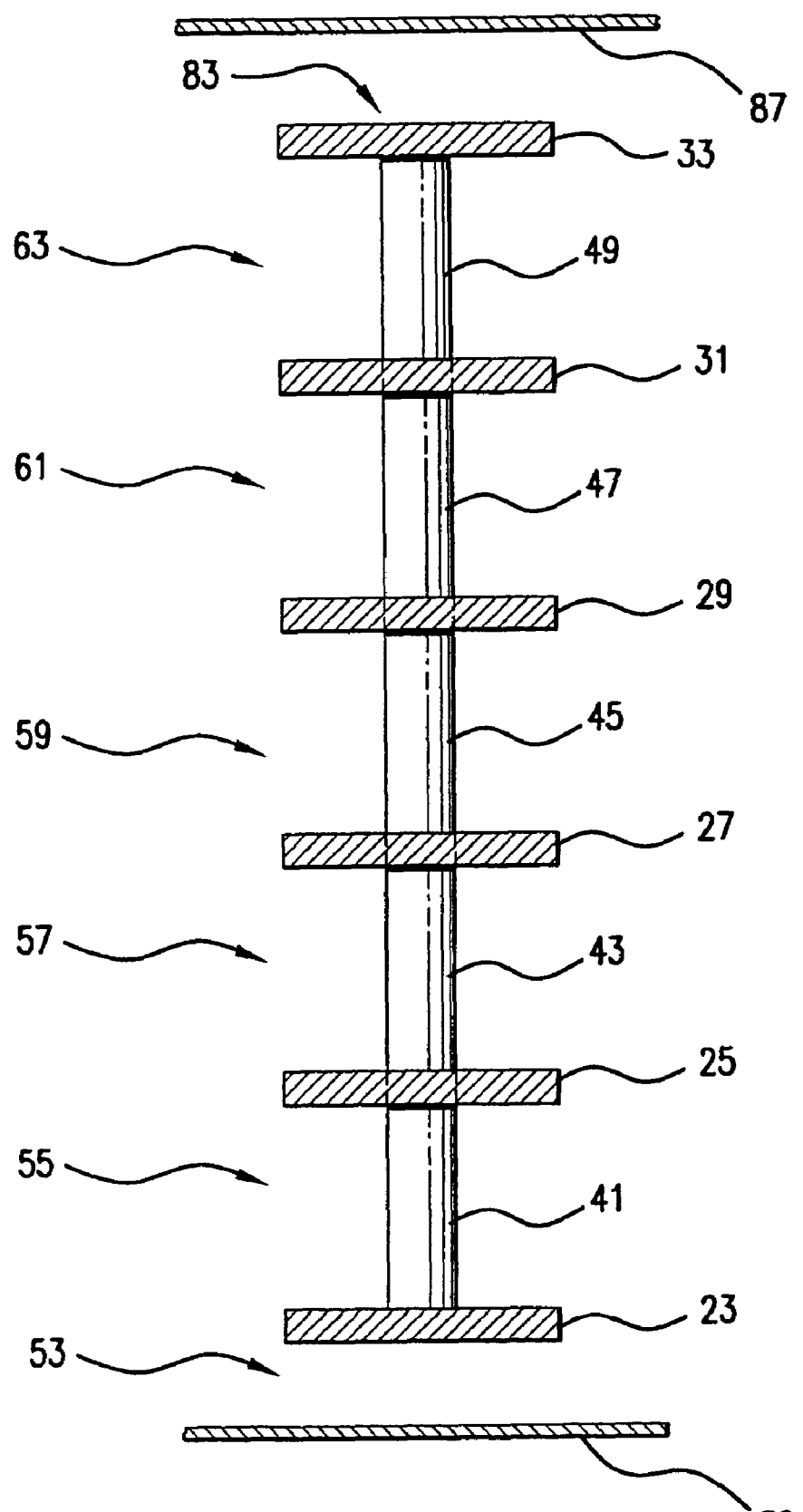
Figure 3:
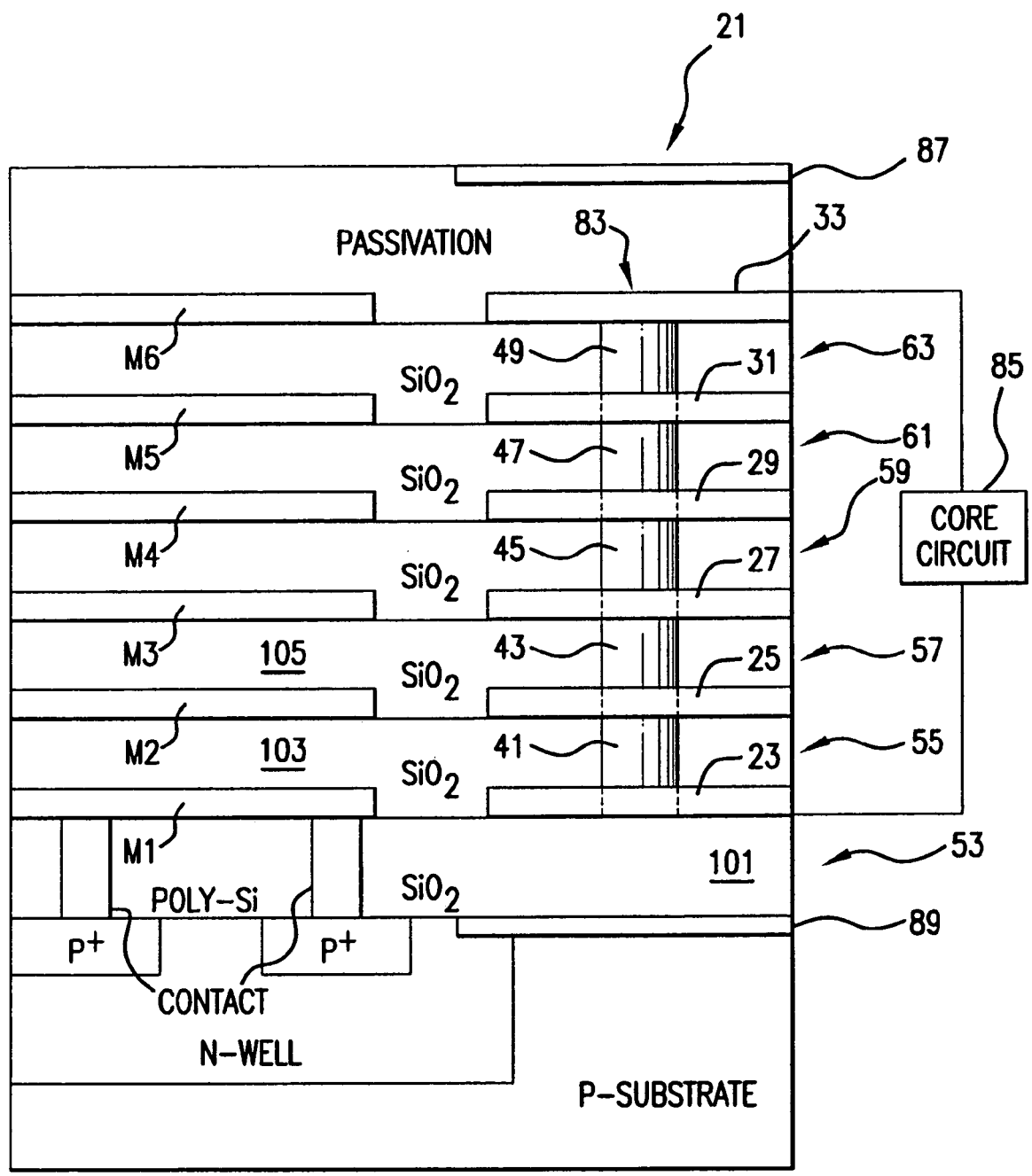

FIGS. 1-3 illustrate the layout of a stacked spiral IC inductor 21. FIGS. 1 and 2 show the inductor structure with the surrounding material removed. FIG. 3 shows surrounding structure and the base layers. In FIGS. 1-3 the inductor 21 is shown with a single stacked via bar magnetic core 83 according to one aspect of the present invention using a typical six-metal IC technology, where there are six metal layers M1-M6, one contact via plug level 53 and five via plug levels 55, 57, 59, 61, and 63. Six planar spiral coils 23, 25, 27, 29, 31, 33 formed from the six metal deposition layers are shown. The electrical connectors 35, 37, 39 connect the spiral coils 23-25, 27-29 and 31-33 at the inside of the coils; and electrical connectors 36, 38 connect coils 25-27 and 29-31 on the outside of the coils. FIG. 3 shows the IC inductor 21 as attached to a core circuit 85 on the same IC.

It will be understood by the person of skill in the art that the illustrated embodiment is for explanatory purposes and that the arrangement of the planar coils, e.g., number of turns, geometry of layout, etc., can be varied to achieve the desired inductance, Q-factor values, and the like while remaining within the spirit of the present invention.

FIGS. 2 and 3 illustrate a side view of the six layer metal interconnect technology IC inductor 21 utilizing a contact 53 and five vias 41, 43, 45, 47, and 49 connecting metal layers M1-M6, respectively, which form the spiral coils of the inductor 21. It will be noted that the five vias 41, 43, 45, 47, and 49 are stacked in vertical alignment to form the magnetic core 83 for the stacked spiral planar inductor coils 23, 25, 27, 29, 31, 33. As discussed below, it may be desirable to use more than one element or bar to form the magnetic core within an IC inductor assembly.

Typical magnetic metallic elements and alloys used for micro-inductor applications and some of their volume resistivities (ρ in μΩ-cm) include Co (ρ~5.81), Fe (ρ~10.1), Ni (ρ~7), Mo (ρ~5-15), NiFe (permalloy, ρ~13), NiFeMo (supermalloy, ρ~12), CoNbZr (ρ~120), CoMoNiFe, FeAlO, and FeSi. Typical conductive metals and alloys that have been developed and used for IC layer electrical interconnects, i.e., contacts and vias, and their resistivities, are Al (ρ~2.6-3), Cu (ρ~1-7), Ti (ρ~42), W (ρ~5-15), Ti:W (ρ~75-200), $TiSi_2$ (ρ~13-16), TiN (ρ~25-200), $WSi_2$(ρ~30-70), Mo, $MoSi_2$ (ρ~40-100), Ni (barrier for Cu), and Co (as silicide), etc. Thus, it can be seen that the traditional titanium tungsten (Ti:W) contact/via material, with resistivity of approximately 75-200 μΩ-cm, is no better of an electrical conductor than some of the above-listed magnetic media.

Also it will be noted that the widely used conductive material Cu has much a higher diffusion constant (D~0.04 $cm^2$/s) than Ni (D~0.013 $cm^2$/s) and Fe (D~0.006 $cm^2$/s) elements desirable for use as a magnetic core. Therefore, it is believed that contamination caused by over-diffusion of nickel, iron, etc., elements during inductor fabrication should not be an issue if proper barrier layers are used, e.g., $WTi_2$, dependant upon the materials used. Adhesive layers surrounding the vias and contacts may be used for good adhesion of the vias and contacts to their plug hole walls.

Thus, it can be seen that some magnetic metals or alloys such as those listed above may be suitably used as conductive material for vias to attain dual magnetic and electrical functionality (i.e., "dual-use") without undue concerns for conductivity and contamination.

It will be appreciated that there may be one or more metallic alloys suitable for the dual-use material of the magnetic core and spiral connectors within the stacked spiral inductor structure. Thus, on-chip inductors according to the present invention can provide improvements in inductor size and performance while allowing the backend process, i.e., any process steps after Si diffusion, to remain a standard, e.g. CMOS, IC fabrication process.

The proposed dual-use magnetic media is desirably, but is not limited to, Co/Ni/Fe based materials. Suitable film deposition techniques for the desirable material may include RF sputtering, chemical vapor deposition (CVD) and electrochemical diffusion (ECD). Since the magnetic core plug building blocks between the metal layers M1-M6 literally are, or can be, vias, the deposition steps can be similar to known via deposition processes and should have excellent high-aspect-ratio filling features.

Figure 4:
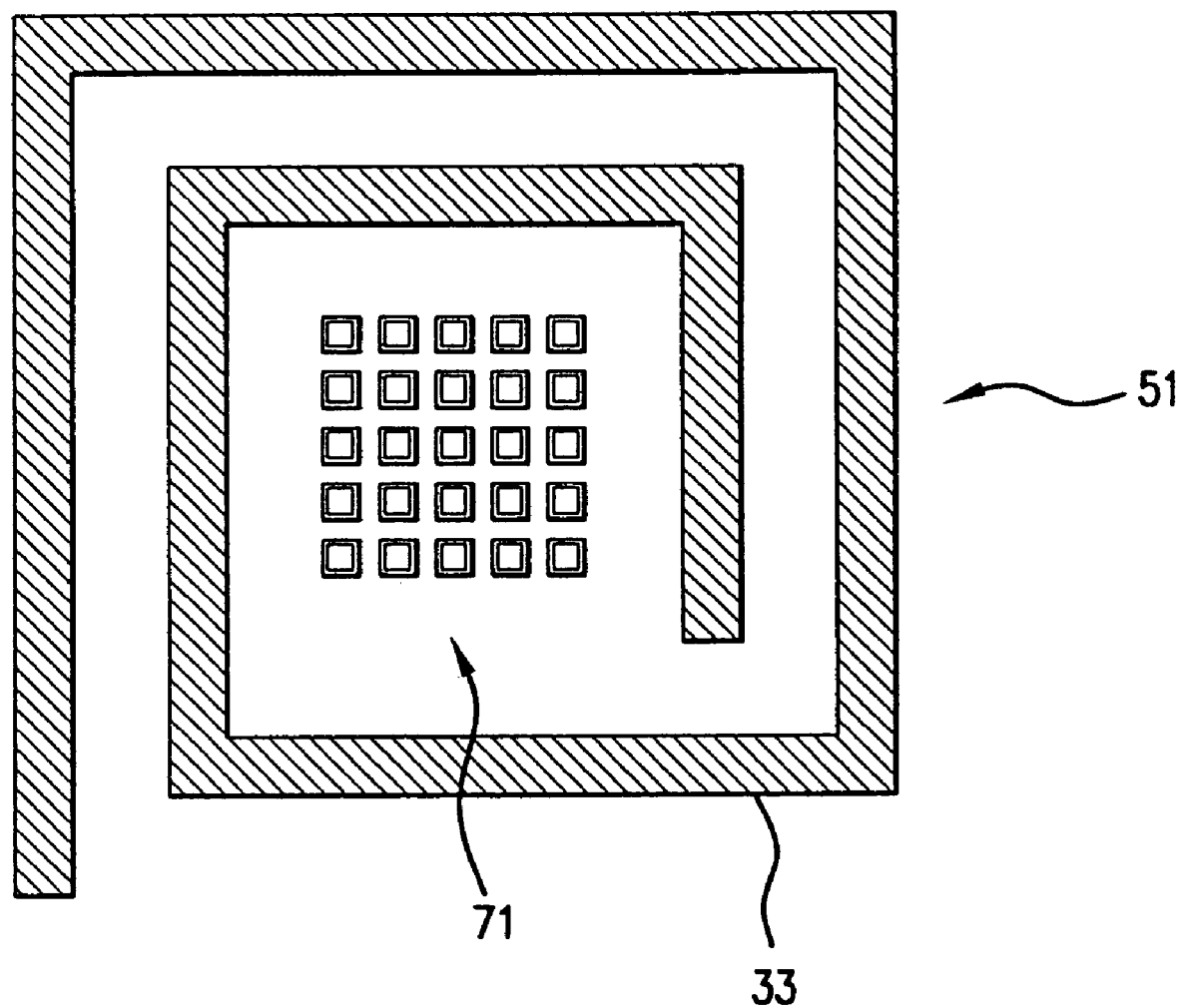
FIG. 4 illustrates a top view of a stacked-spiral inductor with the magnetic core constructed as a 5 column by 5 row array of bars in the center of the spirals.

FIG. 4 illustrates the layout top view of a compact inductor 21 according to the present invention with a 5 column×5 row array 71 of stacked via magnetic bars comprising the magnetic core located centrally within the coils, seen as top coil 33. It is believed that an array of magnetic bars in the core will offer better performance than a bulk, or single element stacked via magnetic core. As to the ultimate number of cores within the array 71, various questions of performance versus fabrication expense may determine the most favorable number and arrangement of the bars for a particular inductor structure.

Referring again to FIG. 3, in an exemplary process for making the IC inductor, after formation of the silicon substrate surface (front end processes), a first insulating layer 101 of $SiO_2$ is deposited. A hole for a contact plug through the first $SiO_2$ layer 101 is then etched or otherwise provided and the contact hole plugged or filled with a conductive material. The first metallic layer M1 is then deposited and etched if necessary to create the first spiral coil 23 thereon. A second SiO$_2$ layer 103 is then laid down and a hole for a first via plug 41 through the second SiO$_2$ layer 103 is made for the first magnetic core element/via 41 along with a hole for the planar spiral connector (not shown) to contact the metal layer M2 to be deposited above. The magnetic core element hole and spiral connector hole can then be filled, desirably with the dual use magnetic/electrically conductive material. A third SiO$_2$ layer 105 is then laid down and a hole for a second via plug 43 through the third SiO$_2$ layer 105 is made for the second magnetic core element via 43 along with a hole for the next planar spiral connector (not shown) to contact the metal layer M3 to be deposited above. The holes are then filled and the process of metal and SiO$_2$ layer deposition for the remaining metal layers M3-M6, and the etching and filling of the via holes are repeated for each remaining via layer 59, 61, 63.

Three different inductor core fabrication techniques are contemplated. The first technique is labeled a zero-cost inductor. Based upon the above discussion, this aspect of the present invention uses the "dual use" magnetic alloy that also serves as an acceptable conductor for all via material of both the magnetic core and the spiral connectors, thus replacing the old via material in the IC. For example, this new magnetic/conductive alloy may be Co:Ni:Fe:Ti:W and may replace all Ti:W as the via material. A new via process will be used in the fabrication line resulting in a somewhat different backend process, however, the new process is still plain-CMOS compatible. Therefore, zero extra cost is expected.

In the second technique, a zero-topography-change inductor can be designed for an assumed worst case in which no acceptable dual-use magnetic/conductive alloy might be found for use in both the spiral connectors and magnetic core elements in the particular IC inductor. In such a case, an acceptable magnetic media (e.g., Co:Fe:Ni) can still be used to make the core elements in the stacked via format. However, these magnetic core elements will be placed only in the magnetic core inside the inductor regions, without any modification to the spiral connectors. This technique will require extra fabrication steps and result in more costs, however, the fabrication of such inductors will not alter the backend topography of the chip, which is a desired property because, as discussed in the previously cited Yamaguchi et al. article, planarization can improve inductor properties.

As further shown in FIGS. 1-3, the third design technique is to fabricate a high performance solenoid-type vertical spiral inductor with a closed-loop magnetic core 85 to eliminate any magnetic flux loses, resulting in a near-ideal inductor having even less magnetic losses and higher Q-factor that the above described inductors. This technique is similar to the zero cost inductor process with thin films for a top cap layer 87 (shown cut away in FIG. 3) and a bottom cap layer 89 of the same, or compatible, magnetic materials deposited adjacent the bottom and top, i.e. each end, of the inductor, equivalent to two extra metal layers. The top and bottom cap layers, 87, 89 are separated from the vertical magnetic core 83, and form a magnetic chamber to confine the magnetic energy inside. Thus, the cap layer films 87, 89 form a closed magnetic circuit with the vertical magnetic core 83. The production of the closed-loop inductors 85 will naturally result in extra process steps, attendant costs, and topographical changes to normal IC processes. Nevertheless, it is expected that the benefits of using these high performance inductors will more than compensate for the extra fabrication costs when such inductors are used in special circuit applications, such as complex SoC designs.

Several vertical spiral inductor structures have been designed according to the present invention and verified with electromagnetic simulation. The designs have included inductors in a commercial 0.18 μm six metal layer copper CMOS technology with a 5×5 bar magnetic core array having very compact size (23 μm×23 μm) and a flat 10 nH value up to 10 GHz.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

I claim:

1. An IC fabrication-compatible spiral inductor, comprising
   the inductor having vertically stacked planar coils made from a plurality of spaced conductive layers;
   the stacked planar coils being electrically connected by coil connectors;
   a magnetic core disposed at a center of and extending perpendicular to each of the planar coils and comprising a plurality of vertically stacked and aligned magnetic elements; and
   the inductor having a footprint dimension of about 75 μm×75 μm or less.

2. The inductor of claim 1, wherein a material forming the magnetic elements is compatible with at least one of CMOS or BiCMOS fabrication technology.

3. The IC fabrication-compatible spiral inductor of claim 1, wherein the magnetic elements comprise electrically conductive and magnetic material.

4. The IC fabrication-compatible spiral inductor of claim 1, wherein the coil connectors comprise the same material as the magnetic elements.

5. The IC fabrication-compatible spiral inductor of claim 4, wherein the magnetic core comprises an array of magnetic element bars within the magnetic core.

6. The inductor according to claim 5, further comprising a film of magnetic material located at at least one end of the stacked planar coils.

7. The inductor according to claim 4, further comprising a film of magnetic material located at at least one end of the stacked planar coils.

8. The IC fabrication-compatible spiral inductor of claim 1, wherein the magnetic core comprises an array of magnetic element bars within the magnetic core.

9. The inductor according to claim 8, further comprising a film of magnetic material located at at least one end of the stacked planar coils.

10. The inductor according to claim 1, further comprising a film of magnetic material located at at least one end of the stacked planar coils.

11. The inductor of claim 1, wherein the inductor is a 10 nH inductor with a footprint dimension of less than 25 μm×25 μm in a 0.1 8 μm six layer metal interconnect copper CMOS technology.

12. The inductor of claim 1, wherein each of the magnetic elements is disposed between two of the plurality of spaced conductive layers.

13. A single chip IC comprising the inductor of claim 1 and a core circuit electrically connected to the inductor.

14. An IC fabrication-compatible spiral inductor, comprising:

a plurality of planar coils disposed in a stacked and parallel orientation;

a plurality of magnetic and conductive vias;

each of the plurality of planar coils electrically connected to an adjacent one of the plurality of planar coils by one of the plurality of the magnetic and conductive vias;

a magnetic core extending perpendicular to and through a center of each of the planar coils, the magnetic core formed of stacked and aligned magnetic elements, wherein each of the stacked and aligned magnetic elements is one of the plurality of the magnetic and conductive vias; and the inductor having a footprint dimension of about 75 μm×75 μm or less.

15. The inductor of claim 14, wherein each of the magnetic elements is disposed between two of the plurality of planar coils.

16. The inductor of claim 14, wherein the magnetic elements and the coil connectors comprise the same material.

17. The inductor of claim 14, wherein the magnetic element materials are compatible with at least one of CMOS or BiCMOS fabrication technology.

18. The inductor of claim 14, wherein the magnetic core comprises an array of parallel magnetic element bars within the magnetic core.

19. The inductor of claim 18, wherein each magnetic element bars of the array of parallel magnetic element bars within the magnetic core comprises a plurality of stacked and aligned magnetic elements.

20. The inductor of claim 18, further comprising a film of magnetic material located at least one end of the stacked planar coils.

21. The inductor of claim 14, further comprising a film of magnetic material located at least one end of the stacked planar coils.

22. The inductor of claim 14, wherein the inductor is a 10 nH inductor with a footprint dimension of 25 μm ×25 μm in a 0.18 μm six layer metal interconnect copper CMOS technology.

23. A single chip IC comprising the inductor of claim 13 and a core circuit electrically connected to the inductor.

* * * * *